(12) United States Patent
Ortner et al.

(10) Patent No.: US 11,796,571 B2
(45) Date of Patent: Oct. 24, 2023

(54) BUSBAR AND POWER MODULE WITH BUSBAR

(71) Applicant: Infineon Technologies AG, Neubiberg (DE)

(72) Inventors: Michael Ortner, Villach (AT); Leo Aichriedler, Puch (AT); Dietmar Spitzer, Völkermarkt (AT); Gerald Wriessnegger, Villach (AT)

(73) Assignee: Infineon Technologies AG, Neubiberg (DE)

( * ) Notice: Subject to any disclaimer, the term of this patent is extended or adjusted under 35 U.S.C. 154(b) by 330 days.

(21) Appl. No.: 16/879,418

(22) Filed: May 20, 2020

(65) Prior Publication Data
US 2020/0381881 A1    Dec. 3, 2020

(30) Foreign Application Priority Data

May 29, 2019 (DE) .......................... 102019114554.6

(51) Int. Cl.
*G01R 15/20* (2006.01)
*G01R 19/00* (2006.01)
*H01R 25/00* (2006.01)

(52) U.S. Cl.
CPC ......... *G01R 15/202* (2013.01); *G01R 15/205* (2013.01); *G01R 19/0092* (2013.01); *H01R 25/00* (2013.01)

(58) Field of Classification Search
CPC ..... G01R 15/202; G01R 15/205; H01R 25/00
See application file for complete search history.

(56) References Cited

U.S. PATENT DOCUMENTS

| 5,041,780 | A | * | 8/1991 | Rippel | G01R 15/207 324/251 |
| 8,461,824 | B2 | | 6/2013 | Ausserlechner et al. | |
| 9,651,581 | B2 | | 5/2017 | Ausserlechner | |
| 10,837,985 | B2 | | 11/2020 | Wolf et al. | |
| 2011/0221429 | A1 | * | 9/2011 | Tamura | G01R 15/207 324/244 |
| 2017/0285075 | A1 | * | 10/2017 | Okuyama | G01R 33/093 |
| 2017/0285076 | A1 | | 10/2017 | Okuyama et al. | |
| 2018/0143226 | A1 | * | 5/2018 | Futakuchi | G01R 33/09 |

(Continued)

FOREIGN PATENT DOCUMENTS

| CN | 102331518 A | 1/2012 |
| CN | 107889527 A | 4/2018 |
| DE | 29812531 U1 | 10/1998 |

(Continued)

OTHER PUBLICATIONS

English translation of WO 0123899 A1 (Year: 2001).*

*Primary Examiner* — Paresh Patel
(74) *Attorney, Agent, or Firm* — Harrity & Harrity, LLP

(57) ABSTRACT

A busbar for current transport comprises conductive material, which extends along a current direction. A recess for a magnetic field sensor extends into the conductive material, a middle of the recess being shifted by a predetermined distance from a middle of the conductive material in the direction of an edge of the conductive material, so that, within a frequency range, a frequency dependency of a magnetic field, which is induced by an alternating current flowing along the current direction, is reduced in comparison with a busbar having a central recess.

20 Claims, 5 Drawing Sheets

(56) References Cited

U.S. PATENT DOCUMENTS

2018/0188294 A1   7/2018   Kawanami

FOREIGN PATENT DOCUMENTS

| | | | |
|---|---|---|---|
| DE | 102016214635 A1 | 3/2017 | |
| JP | 2004132790 A | 4/2004 | |
| JP | 2012078232 A | 4/2012 | |
| JP | 2019105613 A * | 6/2019 | ............... G01R 1/04 |
| WO | WO-0123899 A1 * | 4/2001 | ........... G01R 15/202 |
| WO | 2008030129 A2 | 3/2008 | |
| WO | 2013038867 A1 | 3/2013 | |
| WO | WO-2016056135 A1 * | 4/2016 | ............. G01R 15/20 |

* cited by examiner

BUSBAR AND POWER MODULE WITH BUSBAR

CROSS REFERENCE TO RELATED APPLICATION

This application claims priority to German Patent Application No. 102019114554.6 filed on May 29, 2019, the content of which is incorporated by reference herein in its entirety.

TECHNICAL FIELD

Example implementations relate to busbars and to power modules with busbars.

BACKGROUND

Busbars are used to transport heavy currents, for which reason they often have relatively large cross sections of a few square millimeters. For some applications, it is desirable to be able to measure compactly and economically the current strength that can be transported using a busbar. To this end, for example, magnetic field sensors, with the aid of which the magnetic field generated by the current in the busbar can be measured, may be arranged in an opening passing through the busbar at the center. With prior calibration, this makes it possible to calculate the instantaneous current strength. In some applications, for example in power inverters for electrical motor drives, alternating voltages of variable frequency are generated, which are conducted to the drive at least partially using busbars because of the heavy currents used. With an increasing frequency of the generated voltage, the current strength of eddy currents that are generated in busbars also increases. The eddy currents in turn themselves generate a magnetic field which opposes the magnetic field that is generated by the current flowing in the busbar. With an increasing frequency, the measurement result of the magnetic field sensors at the center of the busbar is thereby systematically vitiated. At relatively high frequencies, they measure a magnetic field that is lower than the magnetic field measured for the same current strength at lower frequencies.

SUMMARY

One example implementation of a busbar for current transport comprises conductive material, which extends along a current direction. A recess for a magnetic field sensor extends into the conductive material, a middle of the recess being shifted by a predetermined distance from a middle of the conductive material in the direction of an edge of the conductive material. The shift is selected in such a way that, within a frequency range, a frequency dependency of a magnetic field, which is induced by a current flowing along the current direction, is reduced in comparison with a busbar having a central recess. The shift of the recess for the magnetic field sensor away from the center of a busbar may lead to the recess being closer to the positions of the high current densities in the conductor at relatively high frequencies than would be the case with a central arrangement. At relatively high frequencies, the positions of high current densities lie closer to the edge of a conductor because of the eddy currents (skin effects) occurring, so that the strength of a magnetic field there increases while the strength of the magnetic field in the interior of the conductor decreases.

Between the edge zone with an increasing magnetic field strength and the zone of decreasing magnetic field strength in the interior of the conductor, zones with an approximately constant magnetic field strength also lie between these two regions. If the recess is positioned in a zone of approximately constant magnetic field strength, above a certain frequency range there is an almost constant magnetic field for a magnetic sensor positioned in the recess. The magnetic field in the recess which is almost constant over the frequency range makes it possible to calculate back to the current strength in the conductor.

One example implementation of a power module for generating supply power for an electrical load comprises a current generating circuit, which is configured to provide a supply voltage, and an example implementation of a busbar, which is coupled to the current generating circuit. A power module which comprises an example implementation of a busbar may make it possible to determine the current strength delivered by the power module inside the power module or in the immediate periphery of the power module, for example in order to provide controllers or regulators for the power module with the actual current strength as an observation variable.

BRIEF DESCRIPTION OF THE FIGURES

Some examples of devices and/or methods will be explained in more detail below merely by way of example with reference to the appended figures, in which.

DESCRIPTION

Various examples will now be described in more detail with reference to the appended figures, in which some examples are represented. In the figures, the thicknesses of lines, layers and/or zones may be exaggerated for illustration.

While further examples are also suitable for various modifications and alternative forms, some specific examples are shown in the figures and will be described in detail below. However, this detailed description does not restrict further examples to the particular forms described. Further examples may include all modifications, correspondences and alternatives which fall within the scope of the disclosure. References which are the same or similar relate throughout the description of the figures to identical or similar elements, which may be implemented in forms that are identical to one another or in a modified form, while they provide the same or a similar function.

It is furthermore to be understood that when an element is referred to as "connected" or "coupled" to another element, the elements may be connected or coupled directly or via one or more intermediate elements. When two elements A and B are combined by using an "or", this is to be understood as meaning that all possible combinations are disclosed, e.g. only A, only B, A and B, unless otherwise explicitly or implicitly defined. An alternative formulation for the same combinations is "at least one of A and B" or "A and/or B". The same applies for combinations of more than two elements.

The terminology which is used here to describe particular examples is not intended to be restrictive for further examples. When a singular is used, e.g. "a, one" and "the", and the use of only a single element is neither explicitly nor implicitly defined as compulsory, further examples may also use a plurality of elements in order to implement the same function. When a function is described below as being implemented by using a plurality of elements, further examples may implement the same function by using a single element or a single processing entity. It is furthermore to be understood that when the terms "comprises", "comprising", "has" and/or "having" are used, they specify the presence of the indicated features, integers, steps, operations, processes, elements, components and/or a group thereof, but do not exclude the presence or the addition of one or more other features, integers, steps, operations, processes, elements, components and/or a group thereof.

Unless otherwise defined, all terms (including technical and scientific terms) are used here with their usual meaning in the field to which the examples described belong.

Figure 1:
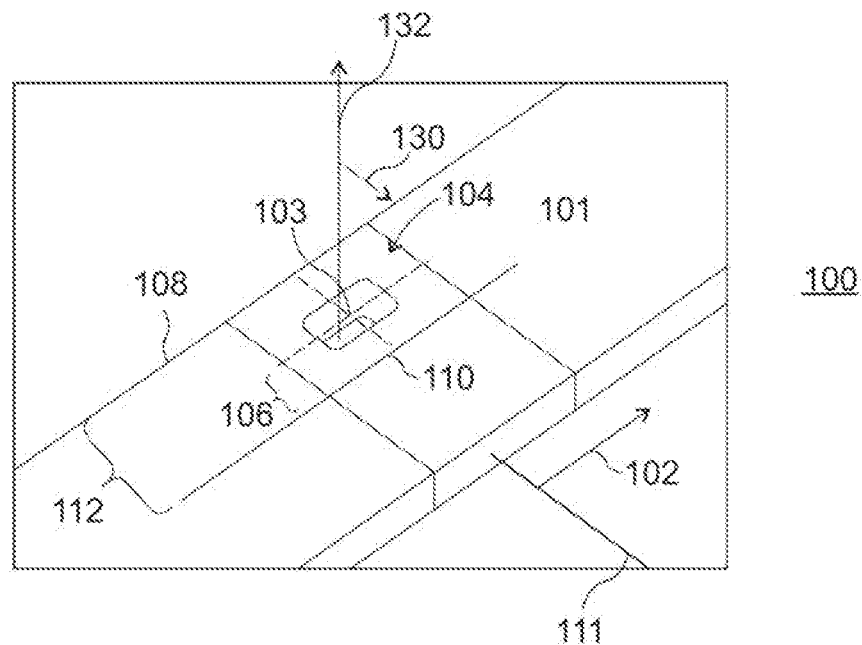
FIG. 1 shows one example implementation of a busbar.

FIG. 1 shows an example implementation of a busbar 100 for current transport. The busbar 100 consists at least partially of conductive material 101, which extends along a current direction 102. Depending on the voltage applied to the busbar, the current flows either in or opposite to the current direction 102. The conductive material 101 may for example be copper or aluminum, although for a further application the conductive material may also consist of a plurality of elements, which are combined with one another in the form of an alloy or in the form of different layers. For example, the center of a conductor may consist of aluminum while the outer zones close to the surface of the conduction cross section may consist of copper.

A recess 104 for a magnetic field sensor extends into the conductive material 101. The recess shown in FIG. 1 passes fully through the rectangular cross section of the busbar 100 shown in FIG. 1. In further example implementations, the recess may also be configured in such a way that, although it offers enough space to be able to accommodate a magnetic field sensor, it does not pass fully through the conductive material. A middle 103 of the recess is shifted by a predetermined distance 106 from a middle 110 of the conductive material 101 in the direction of an edge 108 of the conductive material 101 in such a way that, within a frequency range, a frequency dependency of a magnetic field, which is induced by a current flowing along the current direction 102, is reduced in comparison with a busbar having a central recess.

In the geometry, shown in FIG. 1, of a busbar 100 having a rectangular cross section, which extends perpendicularly to the current direction 102 in a horizontal direction 130 and in a vertical direction 132, the recess extends in the vertical direction 132 into the conductive material 101 and the middle of the recess 104 is shifted in the horizontal direction 130 by the predetermined current distance 102 away from the middle 110 of the busbar 100. In this geometry, the edge 108 in the direction of which the recess 104 is shifted is given by the short side of the rectangular cross section. In other geometries, for example an oval geometry or a not fully rectangular geometry, the recess may be shifted away from a central arrangement in the direction of another edge, for example in the direction of the end of the horizontal or vertical extent (which thereby defines the edge) of a cross section configured in the usual way. The middle of the recess or of the busbar may, for example, be defined in terms of the direction in which the shift takes place.

The size of the predetermined distance 106 depends on the geometry or the cross section of the busbar 100, and may be adapted thereto in such a way that, within a frequency range, a frequency dependency of a magnetic field, which is induced in the recess 104 by a current flowing along the current direction, is reduced in comparison with the same busbar having a central recess. The shift of the recess for the magnetic field sensor away from the center of the busbar 100 may lead to the recess 104 being closer to the positions of the high current densities in the conductor at relatively high frequencies than would be the case with a central arrangement. At relatively high frequencies, the positions of high current densities lie closer to the edge of a conductor because of the eddy currents occurring, so that the strength of the magnetic field locally increases there while the strength of the magnetic field in the middle of the conductor decreases. With suitable positioning of the recess, the shift of the high current densities in the direction of the edge can be approximately compensated for within a particular frequency range, so that an approximately identical magnetic field may then be measured using a magnetic field sensor arranged in the recess over a wider frequency range for an identical current strength.

The predetermined distance 106 is thus to be selected suitably so that this effect occurs within the frequency range. According to some example implementations, the predetermined distance 106 is at least more than 10 percent of the distance 112 between the middle 110 and the edge 108 of the conductive material 101. According to further example implementations, the predetermined distance 106 may be more than 15, 20, 25, 30 or 40 percent of the aforementioned reference quantity.

Figure 2:
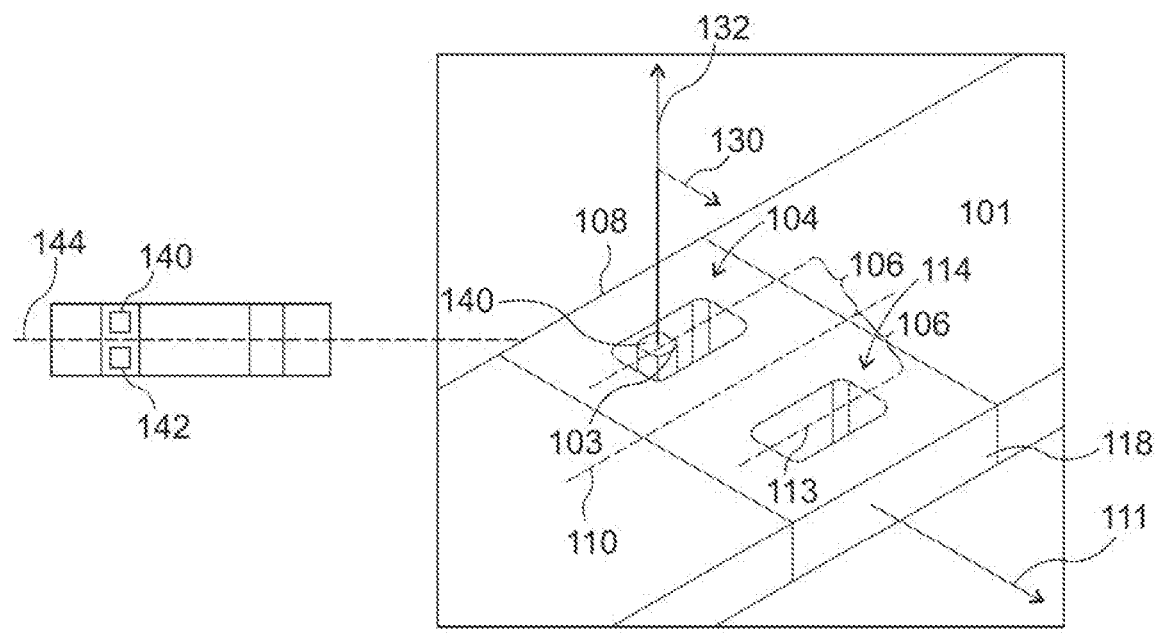
FIG. 2 shows a further example implementation of a busbar having a plurality of recesses.

FIG. 2 shows a further example implementation of a busbar 100, which additionally comprises a further recess 114 that extends into the conductive material 101. The middle 113 of the further recess 114 is shifted by the distance 106 away from the middle 110 of the conductive material 101 in the direction of an edge 118, opposite to the edge 108, of the conductive material 101, so that overall there is a symmetrical arrangement. Even if a magnetic field sensor is not introduced into the further recess 114, for example, the symmetrical configuration of the cross section of the busbar 100 at the position 111 of the recesses 104 and 114 may be advantageous in order to prevent asymmetries of the conduction cross section leading to asymmetrical deformations of the conductor during heating of the conductor. Furthermore, the magnetic field strengths are increased by the additional reduction of the conduction cross section, and the generation of eddy currents is constant over the entire conduction cross section. Both may lead to a reduced dependency of the magnetic field in the recess 104 on the current strength and the frequency.

The example implementation of FIG. 2 furthermore schematically shows a magnetic field sensor 140, which is arranged in the recess 104 in such a way that the magnetic field sensor is sensitive to magnetic field components perpendicular to the current direction 102. Sensitivity for these components of the magnetic field may be independent of the selection of the specific magnetic field sensor, in order to be able to measure the magnetic fields generated by the current flowing in the current direction 102, which according to the right-hand rule run circularly with a surface normal that corresponds to the current direction. As the magnetic field sensor itself, any desired magnetic field-sensitive sensors may be used, for example Hall sensors, GMR sensors or TMR sensors.

The schematic cross section through the busbar 100 at the position 111 of the recess 104, which is represented in FIG. 2, left, shows a further example implementation according to which a further magnetic field sensor 142 is arranged in the recess 104. The further magnetic field sensor 142 is arranged in the recess 104 in such a way that the further magnetic field sensor 142 is also sensitive to the magnetic field components perpendicular to the current direction 102. According to some example implementations, the magnetic field sensor 140 and the further magnetic field sensor 142 are arranged above one another in the vertical direction 132. According to some further example implementations, the magnetic field sensor 140 and the further magnetic field sensor 142 are arranged on different sides of a symmetry plane 144 of the busbar. Arrangement of the magnetic field sensors above one another may have the effect that, if the magnetic field sensor 140 and the further magnetic field sensor 142 are read out in a bridge circuit, externally superimposed magnetic fields interfere with the measurement little or not at all. Such an external perturbing magnetic field influences the measurement by the two magnetic field sensors in the same way, so that subtraction of the measurement values of the two magnetic field sensors, carried out by a bridge circuit, can compensate for the perturbing magnetic field.

Figure 3:
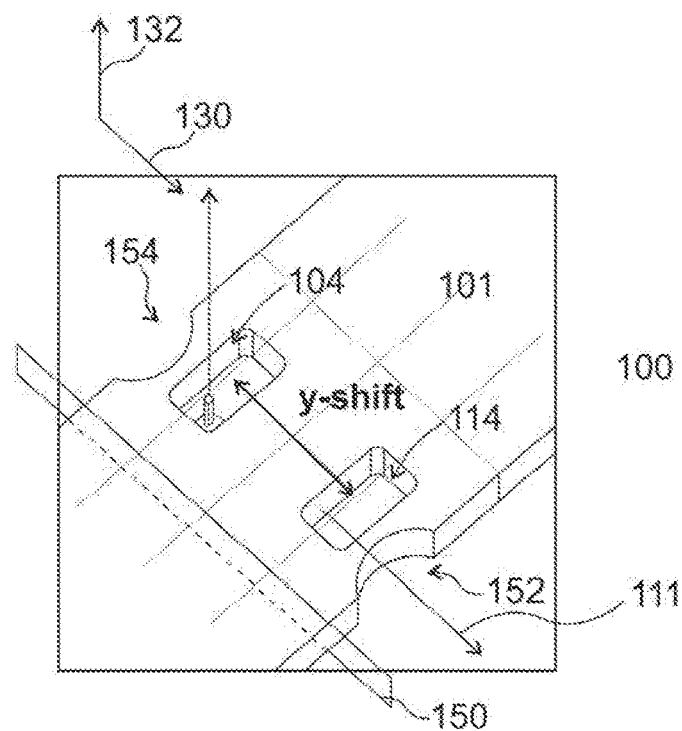
FIG. 3 shows a further example implementation of a busbar having a plurality of recesses and an additional reduction of the cross section at the position of the recess.

FIG. 3 shows a further example implementation of a busbar 100, in which a cross section of the busbar at the position 111 of the recess 104 is reduced in comparison with a cross section of the busbar 100 away from the recess 104 by more than a reduction of the cross section by the recess 104 itself. While the cross section at the position 111 of the recess 104 is already reduced by the recess(es) itself (themselves), FIG. 3 shows an example implementation in which an additional intentional cross-sectional reduction is furthermore carried out using convex indentations 152 and 154. In comparison with a cross section 150 at a position lying away from the position 111 of the recess 104, the cross section is reduced by the convex indentations 152 and 154 beyond the reduction of the cross section by the recesses 104 and 114. By this narrowing of the cross section, in some example implementations the position of the high current density may be brought closer to the recess for the magnetic field sensor, so that the reduction of the magnetic field strength in the recess 104, accentuated by the eddy currents in the busbar at relatively high frequencies, may additionally be compensated for.

According to the example implementation shown in FIG. 3, the additional narrowing of the cross section of the busbar 100 at the position 111 is symmetrical so as not to impair the measurement, for example by asymmetrical deformations of the conductor during heating. Furthermore, the magnetic field strength is thereby increased by the additional reduction of the conduction cross section, and the generation of eddy currents is constant over the entire conduction cross section.

An additional reduction of the cross section of the busbar 100 at the position 111 of the recess 104 may be carried out in any other desired way according to further example implementations.

For example, according to further example implementations the cross section of the busbar 100 at the position 111 of the recess 104 may, in addition or as an alternative, be reduced in the vertical direction 132. Such a reduction may, for example, be carried out over the entire width, e.g. over the entire extent of the busbar 100 in the horizontal direction 130.

According to further example implementations, in addition or as an alternative, the cross section of the busbar 100 at the position 111 of the recess 104 may also be reduced in the horizontal direction. The reductions of the cross section in the horizontal direction 130 or in the vertical direction 132 may, for example, be less than 5, 10, 15 or 20 percent of the total extent of the busbar 100 in the corresponding direction. The cross section may also be reduced symmetrically in these further example implementations.

Figure 5:
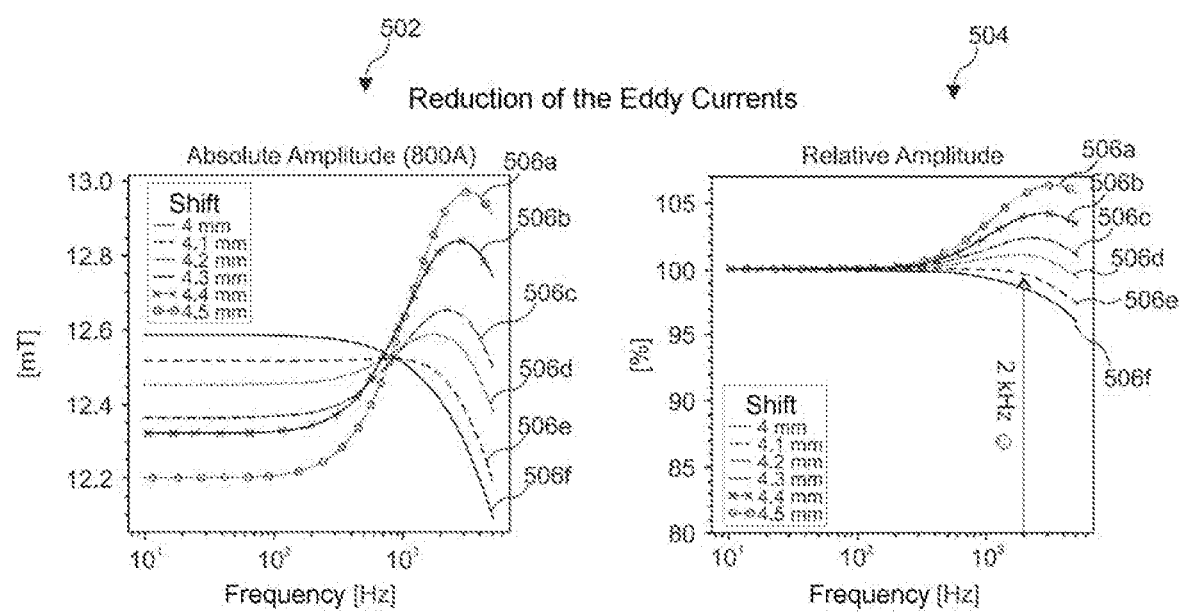
FIG. 5 shows an example of a reduction of the frequency dependency of a magnetic field according to one example implementation.
Figure 6:
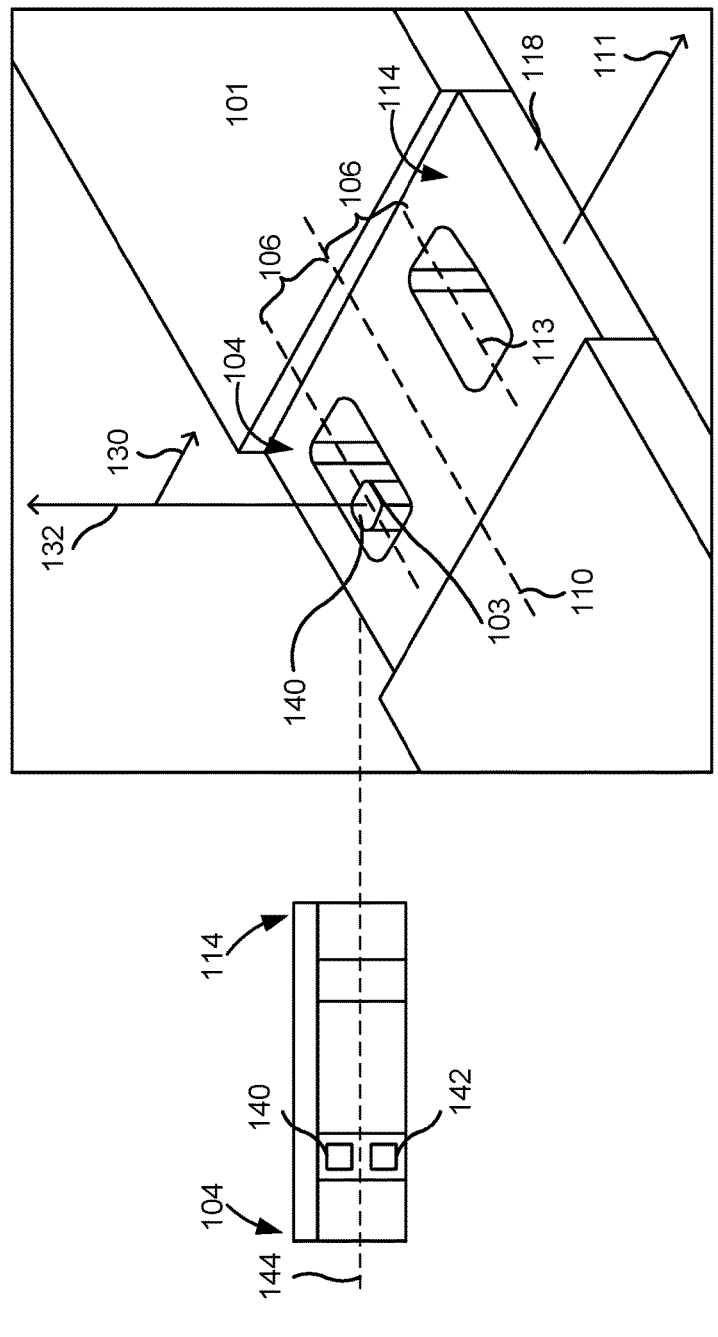
FIG. 6 shows another implementation of a busbar, wherein a cross section of the busbar is reduced in the vertical direction at a position of the recess.
Figure 7:
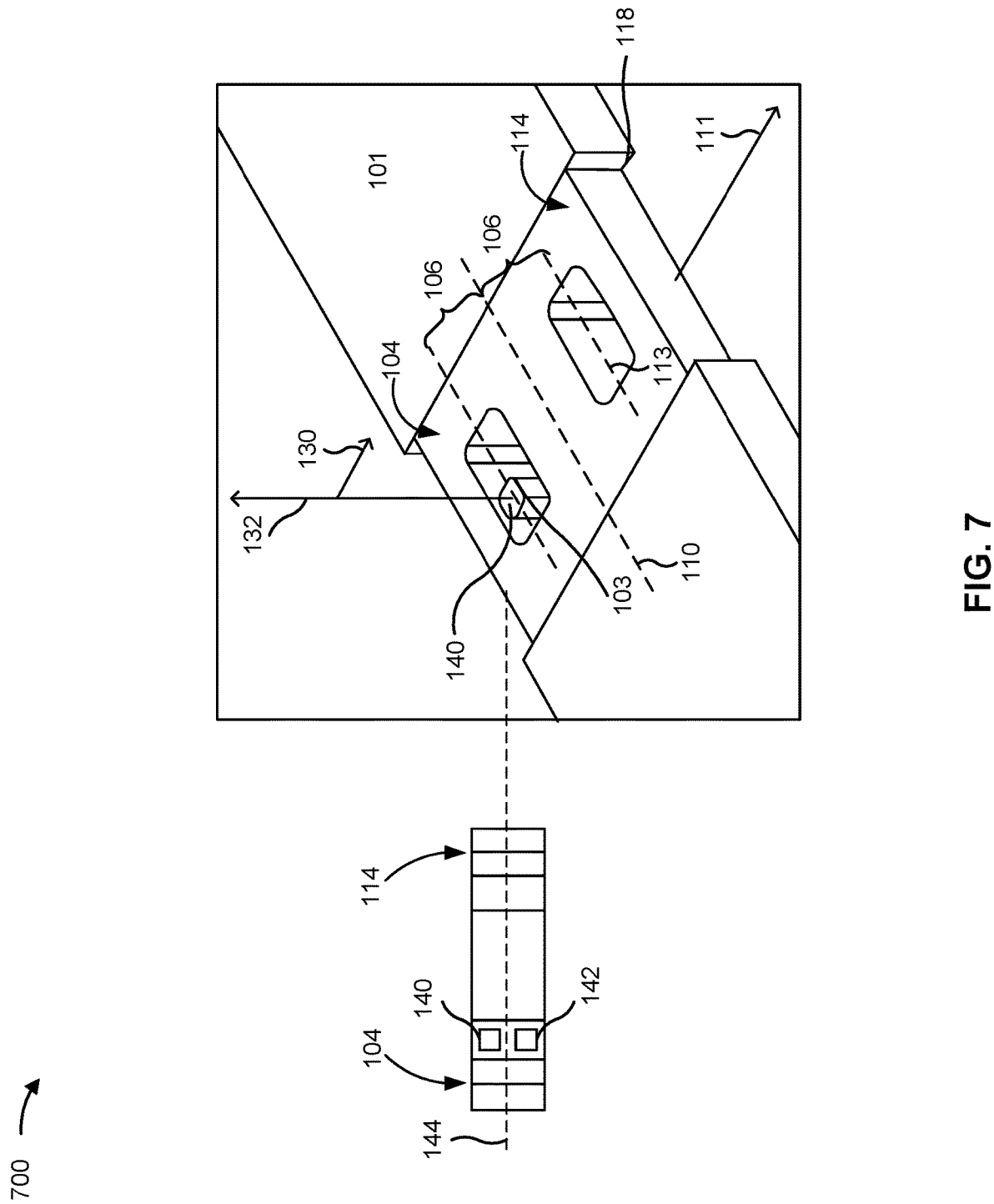
FIG. 7 shows another implementation of a busbar, wherein a cross section of the busbar is reduced symmetrically.

With the above-described example implementations of busbars, the measurement of currents by magnetic field sensors in the recesses in the busbar may be extended to a greater maximum frequency range in comparison with conventional solutions, as for example FIG. 5 shows. FIG. 5 shows 2 diagrams in which, as a function of the frequency of the voltage generated using a power module, the magnetic field strength measured in a recess for an identical current strength of 800 A is represented as a function of the shift, e.g. as a function of the predetermined distance 106 in FIG. 1. In the diagrams, the frequency is plotted on the x axis, and the measured field strength is plotted on the y axis. The left-hand representation 502 in this case shows the measurement value in absolute units of millitesla, the right-hand representation 504 representing the measurement value respectively normalized to the measurement value at low frequencies. The individual graphs 506a to 506e in this case represent shifts, or predetermined distances, of 4.0, 4.1, 4.2, 4.3, 4.4 and 4.5 mm, as may be seen from the legend in the figures. As may be seen from FIG. 5, for a shift by a predetermined distance of 4.1 mm, for the geometry of the busbar as used in the experiment, a significant improvement of the frequency range available to the measurement of up to about 2 kHz may be achieved, while for example the measurement values corresponding to the shifts 4.3, 4.4 and 4.5 mm already depart at significantly less than 1 kHz from the tolerable error range, which is additionally indicated in the right-hand representation 504. Specifically, FIG. 5 shows an example in which it was possible to achieve a variation in the measured current strength of less than 1% up to 5 kHz, even though the original system with a central recess already showed a variation of more than 1% at 200-300 Hz, which increased to more than 20% at 3 kHz.

Figure 4:
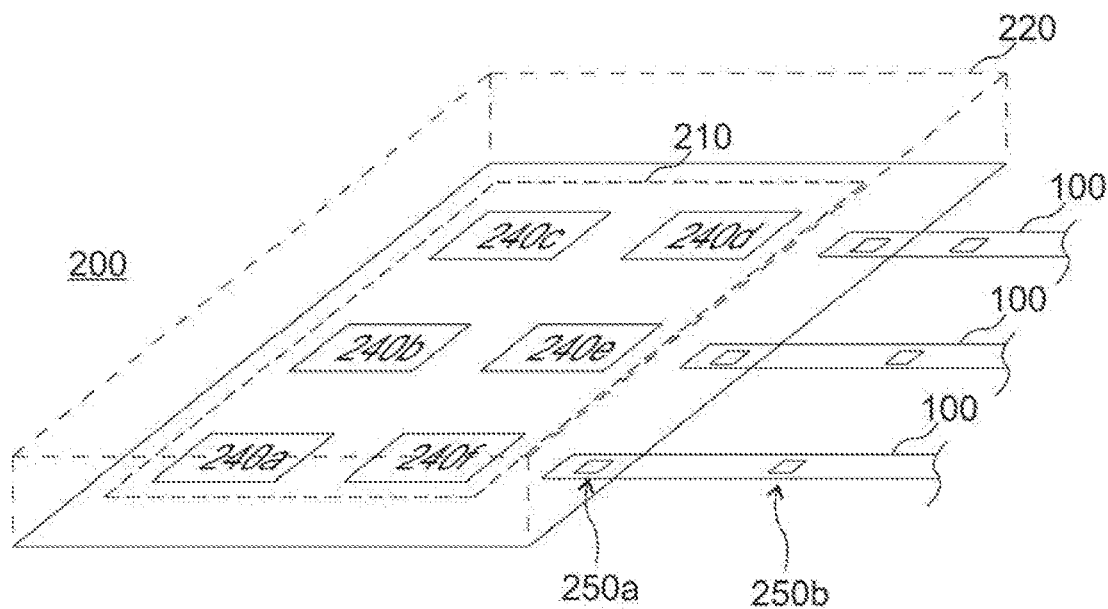
FIG. 4 shows an example implementation of a power module.

FIG. 4 schematically shows an example implementation of a power module 200 for generating a supply power for an electrical load. The power module 200 contains a current generating circuit 210, which functions as a voltage source and is configured to provide a supply voltage. FIG. 4 schematically represents an inverter for generating a 3-phase alternating voltage merely as a specific example of a power module 200. Likewise represented merely schematically are transistors 240a to 240f, for example IGBTs, which may be used in an inverter for generating the alternating voltage. In each case, a busbar 100 according to one of the example implementations above is coupled respectively to one of the phases of the current generating circuit 210. An example implementation of a power module 200, such as is schematically represented in FIG. 4 and which comprises an example implementation of a busbar, may make it possible to determine the current strength delivered by the power module inside the power module or in the immediate periphery of the power module, for example in order to provide controllers or regulators for the power module with the actual current strength as an observation variable. In an application in electrified vehicles, for example, precise knowledge of the current strength in the busbar of a power module used for operating an electric motor may be particularly important, for example in order to be able to control faults, for example when a phase of the electric motor or of the power module fails.

FIG. 4 furthermore represents two alternative positions at which the recess in the busbar 100 may be arranged in relation to an optional housing 220 of the power module. According to a first alternative position 250a, the recess in the busbar 100 may be arranged inside the housing 220. This may make it possible to deliver a power module together with the sensors for determining the current strength as an integral unit. This may in turn possibly reduce the cabling outlay for installation and prevent damage to the magnetic field sensors by external influences.

According to a second alternative position 250b, the recess in the busbar 100 may be arranged outside the housing 220. This may make it possible equip a power module with customer-specific sensors for determining the current strength and increase the flexibility of the system.

The aspects and features which are described in connection with one or more of the examples and figures detailed above may also be combined with one or more of the other examples, in order to replace an equivalent feature of another example or additionally to introduce the feature into the other example.

Only the principles of the disclosure are represented by the description and drawings. Furthermore, all examples mentioned here should expressly be used in principle only for illustrative purposes, in order to assist the reader in understanding the principles of the disclosure and the concepts contributed by the Inventor(s) to further development of the art. All comments herein relating to principles, aspects and examples of the disclosure, and specific examples thereof, include their equivalents.

A functional unit described as "means for . . . " carrying out a particular function may refer to a circuit which is configured to carry out a particular function. A "means for something" may therefore be implemented as a "means configured for or suitable for something", for example a component or a circuit configured for or suitable for the respective task.

Furthermore, the following claims are hereby included in the detailed description, in which each claim per se may constitute a separate example. While each claim per se may constitute a separate example, it is to be noted that—even though a dependent claim may relate in the claims to a particular combination with one or more other claims—other examples may also comprise a combination of the dependent claim with the subject-matter of any other dependent or independent claim. Such combinations are explicitly proposed here, unless it is indicated that a particular combination is not intended. Furthermore, features of one claim may also be included for any other independent claim, even if this claim is not made directly dependent on the independent claim.

The invention claimed is:

1. A busbar for current transport, comprising:
 conductive material that extends along a current direction; and
 a recess for a magnetic field sensor,
 the recess extending into the conductive material,
 a middle of the recess being shifted by a predetermined distance from a middle of the conductive material in a direction of an edge of the conductive material, and
 the predetermined distance being based on a value configured to, within a frequency range, cause a frequency dependency of a magnetic field, which is induced in the recess by an alternating current flowing along the current direction, to be reduced in comparison to when the busbar is configured with a central recess.

2. The busbar as claimed in claim 1, wherein the predetermined distance is more than 10 percent of a distance between the middle of the recess and the edge of the conductive material.

3. The busbar as claimed in claim 1, wherein the recess extends fully through the conductive material.

4. The busbar as claimed in claim 1, further comprising:
 a further recess, which extends into the conductive material,
 a middle of the further recess being shifted by the predetermined distance from a middle of the conductive material in a direction of an opposite edge of the conductive material, and
 the opposite edge lying opposite the edge.

5. The busbar as claimed in claim 1, wherein a cross section of the busbar at a position of the recess is reduced in comparison with a cross section of the busbar away from the recess by more than the cross section of the recess.

6. The busbar as claimed in claim 1, wherein the busbar comprises a cross-sectional area perpendicular to the current direction which has a horizontal extent and a vertical extent, the middle of the recess being shifted in a horizontal direction and the recess extending in a vertical direction into the conductive material.

7. The busbar as claimed in claim 6, wherein a cross section of the busbar is reduced in the vertical direction at a position of the recess.

8. The busbar as claimed in claim 6, wherein a cross section of the busbar is reduced in the horizontal direction at a position of the recess.

9. The busbar as claimed in claim 6, wherein a cross section of the busbar is reduced symmetrically.

10. The busbar as claimed in claim 6, wherein the horizontal extent of the busbar in the horizontal direction is greater than the vertical extent of the busbar in the vertical direction.

11. The busbar as claimed in claim 1, further comprising:
 a magnetic field sensor, arranged in the recess, configured to be sensitive to magnetic field components perpendicular to the current direction.

12. The busbar as claimed in claim 11, further comprising:
 a further magnetic field sensor, arranged in the recess, configured to be sensitive to magnetic field components perpendicular to the current direction.

13. The busbar as claimed in claim 12, wherein the magnetic field sensor and the further magnetic field sensor are arranged on different sides of a symmetry plane of the busbar.

14. A power module for generating supply power for an electrical load, comprising:
 a current generating circuit configured to provide a supply voltage; and
 the busbar according to claim 1 coupled to the current generating circuit.

15. The power module as claimed in claim 14, further comprising:
 a housing which contains the current generating circuit, the recess in the busbar being arranged either inside or outside the housing.

16. The power module as claimed in claim 14, wherein the current generating circuit is configured to provide an alternating voltage.

17. The busbar as claimed in claim 1, wherein a cross section of the busbar at a position of the recess is reduced by one or more convex indentations towards the edge.

18. The busbar as claimed in claim 1, further comprising:
a further recess;
a middle of the further recess being shifted by the predetermined distance from the middle of the conductive material; and
the magnetic field sensor, arranged in the recess, configured to be sensitive to magnetic field components perpendicular to the current direction.

19. The busbar as claimed in claim 18, further comprising:
a further magnetic field sensor, arranged in the recess, configured to be sensitive to magnetic field components perpendicular to the current direction.

20. The busbar as claimed in claim 7, wherein the cross section of the busbar at the position of the recess is reduced by one or more convex indentations towards the edge.

* * * * *